(12) United States Patent
Wachter et al.

(10) Patent No.: US 12,439,570 B2
(45) Date of Patent: Oct. 7, 2025

(54) PULSE INVERTER HAVING A COOLING DEVICE AS WELL AS MOTOR VEHICLE HAVING A PULSE INVERTER

(71) Applicant: Dr. Ing. h.c. F. Porsche Aktiengesellschaft, Stuttgart (DE)

(72) Inventors: Sebastian Wachter, Pressig (DE); Maurice Kleindienst, Woerth am Rhein (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 239 days.

(21) Appl. No.: 18/326,014

(22) Filed: May 31, 2023

(65) Prior Publication Data

US 2023/0397380 A1 Dec. 7, 2023

(30) Foreign Application Priority Data

Jun. 3, 2022 (DE) ...................... 10 2022 114 113.6

(51) Int. Cl.
*H05K 7/20* (2006.01)
*B60L 50/51* (2019.01)
(Continued)

(52) U.S. Cl.
CPC ............ *H05K 7/2089* (2013.01); *B60L 50/51* (2019.02); *B60L 50/60* (2019.02); *H02M 7/003* (2013.01); *B60L 2210/40* (2013.01); *H02P 27/06* (2013.01)

(58) Field of Classification Search
CPC .......... H05K 7/20163; H05K 7/20863–80872; H05K 7/20909–20927
See application file for complete search history.

(56) References Cited

U.S. PATENT DOCUMENTS 6,262,891 B1 * 7/2001 Wickelmaier ...... H05K 7/20909
174/15.1
6,493,227 B2 * 12/2002 Nielsen .............. H05K 7/20918
165/59

(Continued)

FOREIGN PATENT DOCUMENTS

DE 102016218451 A1 3/2018
DE 102018203596 A1 9/2019
(Continued)

*Primary Examiner* — Robert J Hoffberg
(74) *Attorney, Agent, or Firm* — LEYDIG, VOIT & MAYER, LTD.

(57) ABSTRACT

A pulse inverter for operating an electric machine of a motor vehicle includes a power module for converting DC current provided by a motor vehicle battery into AC current. The pulse inverter includes a cooling device for cooling components of the pulse inverter by an electrically insulating cooling fluid flowing through the cooling device, wherein the cooling device includes a fluid-tight housing. Cooling fluid flowing through the fluid-tight housing is in direct contact with at least one of the components of the pulse inverter to be cooled. The cooling device includes a cooling channel. The power module is thermally connected to an outer surface of the cooling channel, wherein the cooling channel includes an output. The output opens into the fluid-tight housing, so that the cooling fluid flowing through the cooling device first flows through the cooling channel and subsequently the fluid-tight housing.

11 Claims, 7 Drawing Sheets

(51) Int. Cl.
  *B60L 50/60* (2019.01)
  *H02M 7/00* (2006.01)
  *H02P 27/06* (2006.01)

(56) References Cited

U.S. PATENT DOCUMENTS

| | | | | |
|---|---|---|---|---|
| 9,192,079 | B2* | 11/2015 | Loth | H05K 7/20918 |
| 9,578,786 | B1* | 2/2017 | Beall | H05K 7/20754 |
| 10,609,839 | B1* | 3/2020 | Archer | H05K 7/20236 |
| 11,937,412 | B2* | 3/2024 | Diedrichs | H05K 7/20181 |
| 12,156,387 | B2* | 11/2024 | She | H02M 7/003 |
| 2002/0026996 | A1* | 3/2002 | Krieger | H05K 7/20909 |
| | | | | 165/47 |
| 2013/0039008 | A1 | 2/2013 | Hoffmann et al. | |
| 2014/0313806 | A1 | 10/2014 | Shinohara et al. | |
| 2022/0052583 | A1 | 2/2022 | Engelhardt et al. | |

FOREIGN PATENT DOCUMENTS

| | | |
|---|---|---|
| DE | 112012004496 A1 | 11/2021 |
| DE | 102020121432 A1 | 2/2022 |
| EP | 2557676 A1 | 2/2013 |

\* cited by examiner

PULSE INVERTER HAVING A COOLING DEVICE AS WELL AS MOTOR VEHICLE HAVING A PULSE INVERTER

CROSS REFERENCE TO RELATED APPLICATIONS

This application claims benefit to German Patent Application No. DE 10 2022 114 113.6, filed on Jun. 3, 2022, which is hereby incorporated by reference herein.

FIELD

The present invention relates to a pulse inverter having a cooling device as well as a motor vehicle having a pulse inverter. A pulse inverter is used in order to convert DC current into AC current in order to operate an electric machine with AC current. Accordingly, in an electrically or semi-electrically operated motor vehicle, the DC current provided from a motor vehicle battery, usually a high-voltage battery, is converted into AC current by the interposed pulse inverter. The reverse direction can also be provided, i.e. the conversion of AC current into DC current, for example when the electric machine is operating in a generator mode.

BACKGROUND

A pulse inverter typically has multiple phase systems each comprising at least one power module having a semiconductor structural part. By means of the semiconductor structural part, in particular semiconductor switches, for example, an outer conductor of the respective phase system can be switched periodically for the conversion of DC current into AC current, such that an AC current is applied in the outer conductor. For example, the semiconductor structural parts can be FETs (field effect transistors) or IGBTs (insulated-gate bipolar transistors). However, JFETs (junction-gate field effect transistors) or MOSFETs (metal oxide semiconductor field-effect transistors) are also conceivable.

The semiconductor structural parts of the power modules have an ohmic resistance, which, in case of current flow, leads to waste heat and thus to an increase in temperature. In order to protect the power module(s) from overheating, cooling devices are usually provided. Further components of the pulse inverter, such as DC link capacitors or contact bars, also have an ohmic resistance so that these components of the pulse inverter also heat up during the operation of the pulse inverter.

For example, it is known from DE 10 2016 218 451 A1 to mount the power modules on a heat sink, wherein this heat sink is configured as an extrusion profile.

SUMMARY

In an embodiment, the present disclosure provides a pulse inverter for operating an electric machine of a motor vehicle, comprising a power module for converting DC current provided by a motor vehicle battery into AC current. The pulse inverter comprises a cooling device for cooling components of the pulse inverter by an electrically insulating cooling fluid flowing through the cooling device, wherein the cooling device comprises a fluid-tight housing. Cooling fluid flowing through the fluid-tight housing is in direct contact with at least one of the components of the pulse inverter to be cooled. The cooling device comprises a cooling channel. The power module is thermally connected to an outer surface of the cooling channel, wherein the cooling channel comprises an output. The output opens into the fluid-tight housing, so that the cooling fluid flowing through the cooling device first flows through the cooling channel and subsequently the fluid-tight housing.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
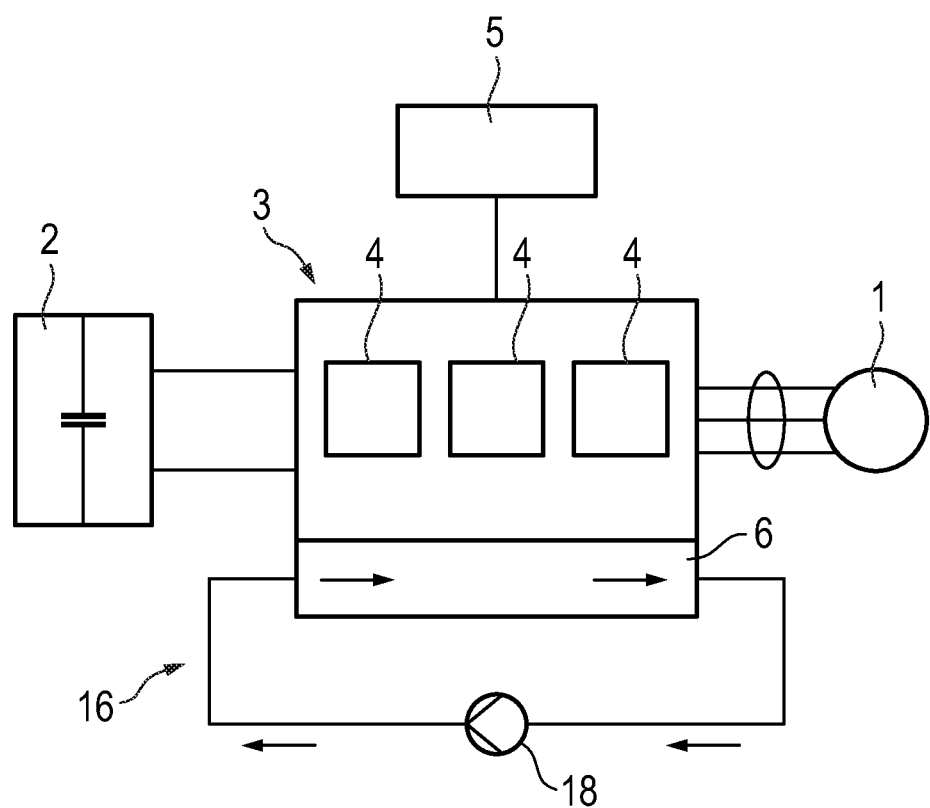
FIG. 1 illustrates a propulsion system of an electrically or semi-electrically driven vehicle in a schematic illustration.

In an embodiment, the present invention provides a pulse inverter having an improved cooling device that ensures a particularly efficient cooling of the pulse inverter. In an embodiment, the present invention provides a motor vehicle having such a pulse inverter.

The pulse inverter according to an embodiment of the invention is used in order to operate an electric machine of a motor vehicle, in particular to operate an electric motor. The pulse inverter comprises at least one power module, wherein this power module serves to convert DC current supplied by a motor vehicle battery into AC current. The pulse inverter comprises a cooling device for cooling components of the pulse inverter by means of an electrically insulating cooling fluid flowing through the cooling device. The cooling device comprises a fluid-tight housing that is flowed through by the electrically insulating cooling fluid, wherein the cooling fluid flowing through the fluid-tight housing is in direct contact with one of the components of the pulse inverter to be cooled. The cooling device further comprises a cooling channel, wherein the power module is thermally connected to an outer surface of the cooling channel, wherein the cooling channel comprises an output, wherein the output opens into the fluid-tight housing such that the cooling fluid flowing through the cooling device first flows through the cooling channel and subsequently the fluid-tight housing.

The advantage of the aforementioned design of the cooling device is that the relatively cold cooling fluid first flows through the cooling channel, thereby cooling the power module particularly efficiently, because the power module is in thermal contact with the cooling channel and thus the relatively cold cooling fluid flowing in the cooling channel is used in order to cool the power module. The power module is typically the component of the pulse inverter that has the greatest cooling demand. The cooling demand of further components, for example contact bars and/or DC link capacitors, on the other hand, is usually less than the cooling demand of power modules. Only subsequent to the cooling channel does the cooling fluid then flow into the fluid-tight housing through the waste heat of the power modules and thus come into direct contact with other components and/or the power module in order to cool it, and then continues to heat up. With the design according to embodiments of the invention, a particularly efficient and sufficient cooling of the power module can be achieved, because relatively cold cooling fluid is purposefully directed towards the power modules and the cooling fluid only subsequently floods the fluid-tight housing and thus only subsequently comes into direct contact with the further component(s) of the pulse inverter to be cooled. If all of the components were merely cooled in the same manner, for example, by flooding a fluid-tight pulse inverter housing, i.e. without targeted conduction of relatively cold cooling fluid to the power module, in particular the power modules, an insufficient cooling of the respective power module may not be guaranteed, or the cooling fluid may have to have a lower temperature for a sufficient cooling, or the flow rate would have to be increased, which would increase a power demand of the cooling system.

It is considered particularly advantageous when the pulse inverter comprises multiple power modules, wherein the multiple power modules are thermally connected to the outer surface of the same cooling channel. In this respect, the same cooling channel serves to cool multiple power modules.

It is considered particularly advantageous when the power module is in direct contact with the cooling fluid flowing in the fluid-tight housing. In this respect, in the flow direction of the cooling fluid, first an indirect cooling of the power modules takes place via the cooling channel and subsequently a direct cooling of the power modules via direct contact with the cooling fluid.

It is considered particularly advantageous when the power module as such in turn has a fluid-tight power module housing, wherein the semiconductor structural parts or semiconductor device are arranged within the power module housing. This fluid-tight power module housing ensures that the semiconductor structural parts do not come into direct contact with the cooling fluid, thereby avoiding damage to the power electronics or semiconductor structural parts due to conductive contaminants of the cooling fluid.

Preferably, the power module is arranged within the fluid-tight housing of the pulse inverter.

Preferably, the fluid-tight housing forms a pulse inverter housing that encloses all components of the pulse inverter.

It is considered particularly advantageous when the cooling channel is arranged such that the fluid-tight housing contacts cooling fluid flowing through one or all outer surfaces of the cooling channel. It is considered particularly advantageous when the cooling channel is arranged within the fluid-tight housing such that the cooling fluid flowing through the housing flows around the cooling channel. In this respect, the cooling channel is surrounded by the cooling fluid on its outside and on its inside. Preferably, the cooling fluid flowing in the fluid-tight housing flows around the cooling channel in the opposite flow direction of the cooling fluid in the cooling channel. By reversing the flow direction, as homogeneous a cooling as possible can be achieved.

The electrically insulating cooling fluid is in particular a dielectric cooling fluid, preferably a cooling oil.

In a preferred embodiment, it is provided that multiple power modules, multiple DC link capacitors, and multiple live contact bars connected to the power modules are arranged in the fluid-tight housing, wherein the cooling fluid flowing through the housing is in direct contact with the multiple power modules, the multiple DC link capacitors, and the multiple live contact bars.

The cooling channel is preferably configured as an extrusion profile. It is certainly conceivable that a cooling structure has been introduced into the cooling channel, for example, it has been shrunk or compressed in order to provide a targeted guiding or conduction of the cooling fluid in the cooling channel.

In a preferred embodiment, the respective power module is connected to the outer surface of the cooling channel in a material-locking fashion, for example soldered or glued. It is considered particularly advantageous when the power module comprises an external cooling plate, for example made of copper, wherein this cooling plate contacts the outer surface of the cooling channel. As a result, a particularly efficient indirect cooling can be achieved. In this regard, it is considered particularly advantageous when a power module housing of the power module fluid-tightly encloses an interior space of the power module, wherein the cooling plate is exposed and contacts the cooling channel.

It is considered particularly advantageous when the cooling channel is formed between the power modules and the DC link capacitors.

In a preferred embodiment, it is provided that the cooling device comprises a further cooling channel, wherein the DC link capacitors are thermally connected to an outer surface of the further cooling channel, wherein the further cooling channel comprises an output, wherein the output of the further cooling channel opens into the one cooling channel such that the cooling fluid flowing through the cooling device initially flows through the further cooling channel, subsequently flows through the one cooling channel, and subsequently the fluid-tight housing.

In a preferred embodiment, it is provided that the pulse inverter comprises a first row of power modules and a cooling channel associated with the first row of power modules, wherein the power modules of the first row are thermally connected to the outer surface of the associated cooling channel, and wherein the pulse inverter comprises a second row of power modules and a cooling channel associated with the second row of power modules, wherein the power modules of the second row are thermally connected to the outer surface of the associated cooling channel, wherein the outputs of the two cooling channels open into the same fluid-tight housing, so that the cooling fluid flowing through the cooling device first flows through the respective cooling channel and subsequently flows through the housing.

The motor vehicle according to an embodiment of the invention comprises a motor vehicle battery, an electric machine, and a pulse inverter for operating the electric machine. The pulse inverter comprises a power module for converting DC current supplied by the motor vehicle battery into AC current. The pulse inverter comprises a cooling device for cooling components of the pulse inverter by means of an electrically insulating cooling fluid flowing through the cooling device. The cooling device comprises a fluid-tight housing, wherein the cooling fluid flowing through the fluid-tight housing is in direct contact with one of the components to be cooled. The cooling device further comprises a cooling channel, wherein the power module is thermally connected to an outer surface of the cooling channel, wherein the cooling channel comprises an output, wherein the output opens into the fluid-tight housing such that the cooling device first flows through the cooling channel and subsequently the fluid-tight housing.

It is considered particularly advantageous when the motor vehicle comprises a machine cooling system for cooling the electric machine, wherein cooling fluid flowing out the fluid-tight housing flows into the machine cooling system.

In this context, it is considered particularly advantageous when the cooling fluid flowing from the cooling device to the machine cooling system directly contacts and thereby cools contact bars that electrically connect the pulse inverter and the electric machine.

The embodiments described in connection with the pulse inverter apply accordingly for the motor vehicle and vice versa.

In the following figures, embodiments of the invention are explained in greater detail with reference to embodiment examples, without being limited thereto.

FIG. 1 shows components of a propulsion system of an electrically or semi-electrically driven vehicle in a schematic illustration. The propulsion system comprises an electric machine 1, a motor vehicle battery 2, and a pulse inverter 3 for converting the DC current supplied by the motor vehicle battery 2 into an AC current for operating the electric machine 1. The pulse inverter 3 comprises multiple power modules 4, wherein these power modules 4 comprise a power electronics in the form of semiconductor structural parts. Furthermore, the propulsion system comprises a control unit 5, wherein this control unit 5 drives the pulse inverter 3 in such a way that the DC voltage of the motor vehicle battery 2 is converted into an alternating voltage for driving the electric machine 1. During the operation of the pulse inverter 3, very high electrical currents flow through the semiconductor structural parts of the power modules 4. The resulting ohmic losses lead to a heating of the power modules 4. This heat must be dissipated. For this purpose, the power modules 4 are cooled by a cooling device 6, which is a component of a cooling circuit 16 in which a cooling fluid flows. The flow direction of the cooling fluid is indicated by the arrows in FIG. 1.

Figure 2:
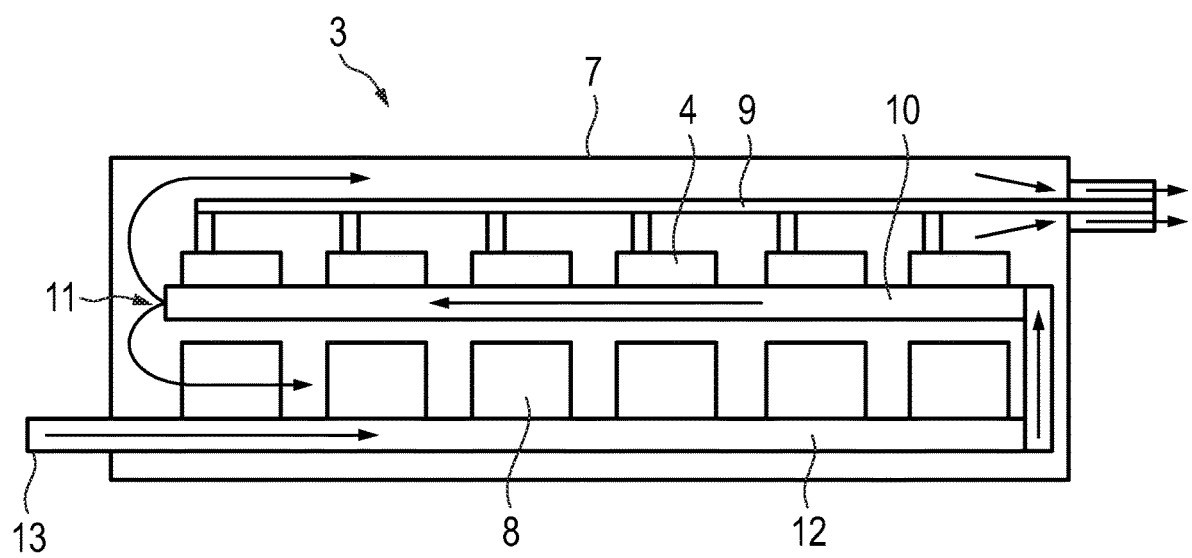
FIG. 2 illustrates an interior view of a pulse inverter in a schematic illustration.
Figure 3:
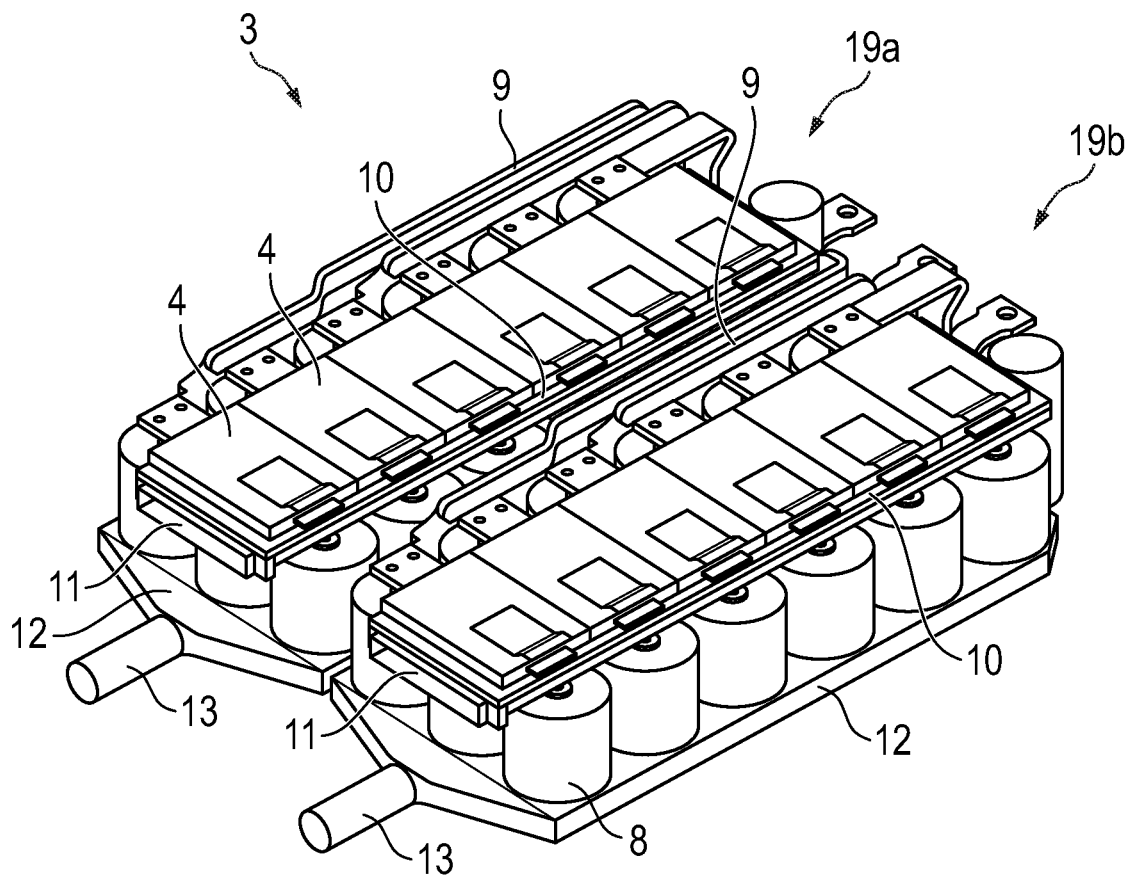
FIG. 3 illustrates an interior view of the pulse inverter in a perspective illustration.
Figure 4:
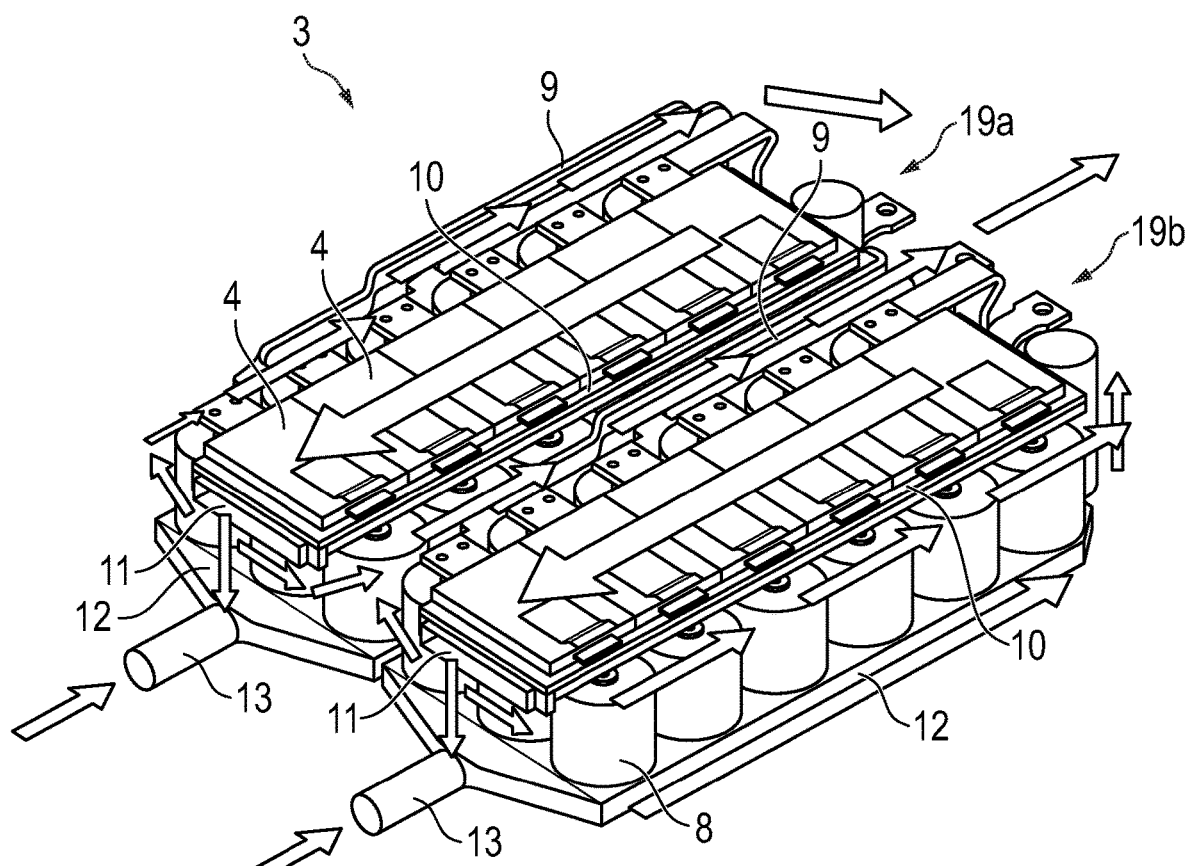
FIG. 4 illustrates the interior view of the pulse inverter according to FIG. 3 with schematically illustrated flow directions of the cooling fluid.

The configuration of the cooling device 6 of the pulse inverter 3 is shown in greater detail in FIGS. 2 to 4, wherein FIG. 2 is merely a schematic illustration.

The cooling device 6 comprises a fluid-tight housing 7, wherein the cooling fluid flowing through the fluid-tight housing 7 is in direct contact with the components to be cooled. In the present case, the components of the pulse inverter 3 around which the cooling fluid flows directly are the power modules 4, DC link capacitors 8, and contact bars 9. The cooling fluid is a dielectric cooling fluid, for example a cooling oil. Therefore, a direct contacting of the live components by the cooling fluid can take place without the risk of a short-circuit or current flow via the cooling fluid. An isolation of the live components, which would adversely affect the cooling effect, can therefore be omitted.

The cooling device 6 comprises a cooling channel 10, wherein the cooling channel 10 is configured as an extrusion profile. The power modules 4 are directly soldered to an outer surface of the cooling channel 10. An output 11 of the cooling channel 10 opens into the fluid-tight housing 7 so that the cooling fluid flowing through the cooling device 6 first flows through the cooling channel 10 and subsequently through the fluid-tight housing 7. In other words, the cooling oil exiting the cooling channel 10 at the output 11 floods the entire interior of the pulse inverter 3, which is enclosed by the fluid-tight housing 7.

In the embodiment of the pulse inverter 3 shown in FIGS. 2 to 4, the cooling channel 10 is arranged between the DC link capacitors 8 and the power modules 4. Furthermore, the cooling device 6 comprises a further cooling channel 12, wherein said cooling channel 12 is used for the indirect cooling of the DC link capacitors 8. For this purpose, the DC link capacitors 8 are thermally connected to an outer surface of the further cooling channel 12. The further cooling channel 12 comprises an input 13 for the cooling fluid and opens into the one cooling channel 10, which serves to cool the power modules 4. Accordingly, the cooling fluid flowing through the cooling device 6 first flows through the further channel 12, subsequently through the one cooling channel 10 and subsequently through the fluid-tight housing 7.

As can be seen in particular in FIGS. 3 and 4, the pulse inverter 3 comprises a first row 19a of power modules 4 and a second row 19b of power modules 4. The respective row 19a, 19b of power modules 4 is associated with a separate cooling channel 10 and the associated DC link capacitors 8 with a further cooling channel 12. The two aforementioned arrangements are arranged in the same housing 7.

Figure 5:
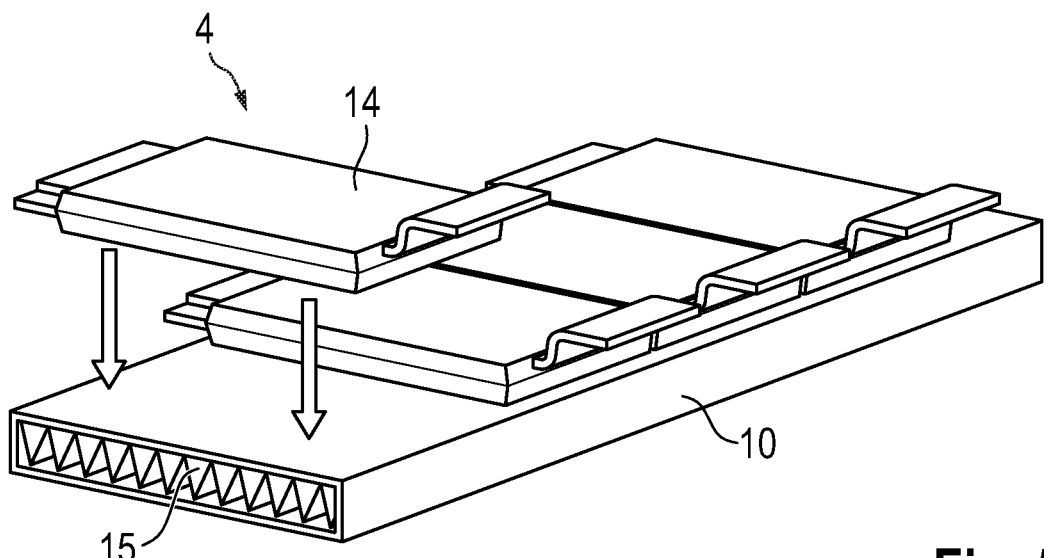
FIG. 5 illustrates an embodiment of a cooling channel of the cooling device in a perspective view.
Figure 6:
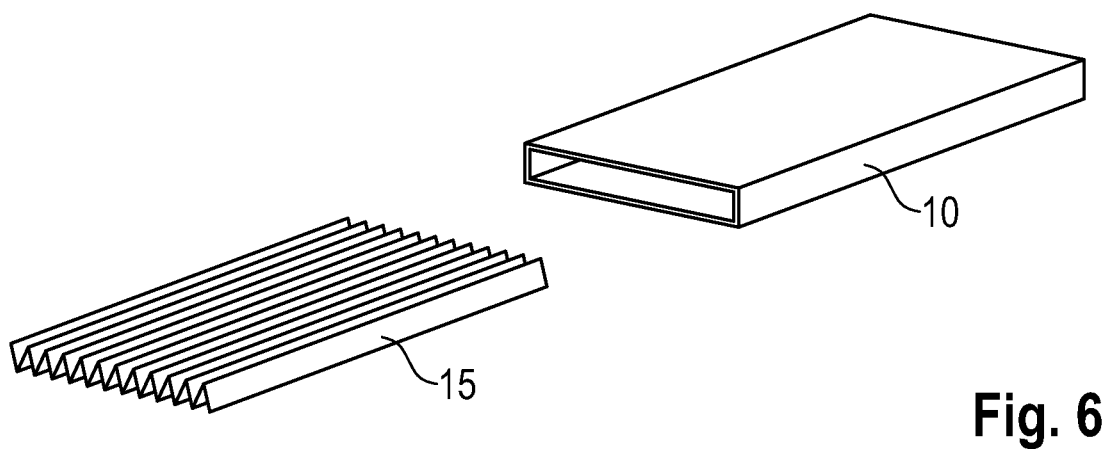
FIG. 6 illustrates components of the cooling channel according to FIG. 5 in a perspective illustration.

In FIG. 5, the cooling channel 10 with power modules 4 arranged thereon is shown in greater detail. The power modules 4 each comprise a closed, fluid-tight power module housing 14, which is directly surrounded by the cooling fluid flowing in the housing 7. The power module housing 14 prevents the cooling fluid from directly contacting the semiconductor structural parts. The power modules 14 are soldered to the cooling channel 10 in the region of a bottom of the respective power module 4. For better thermal conduction, the respective power module 4 comprises a heat-conducting cooling plate made of copper at its bottom.

Figure 7:
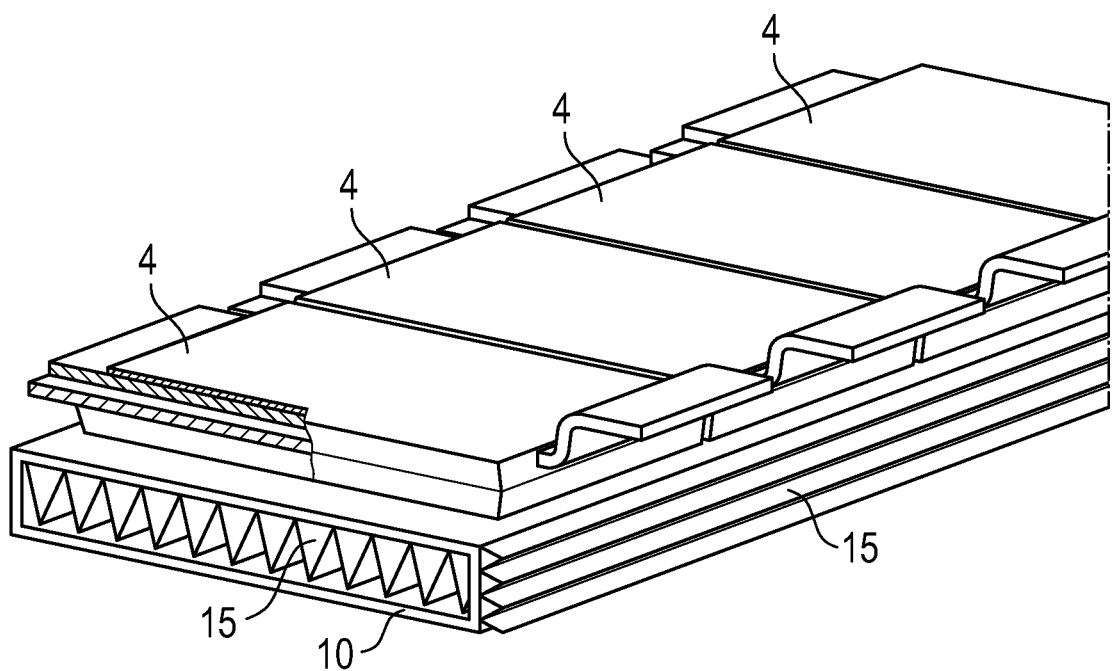
FIG. 7 illustrates a further embodiment of the cooling channel in a perspective illustration.

An undulating cooling structure 15 is introduced in the cooling channel 10 in order to improve the heat transfer from the power modules 4 to the cooling fluid flowing in the cooling channel 10. Such a cooling structure 15 can also be attached to an outer surface of the cooling channel 10, as exemplified in FIG. 7.

Figure 8:
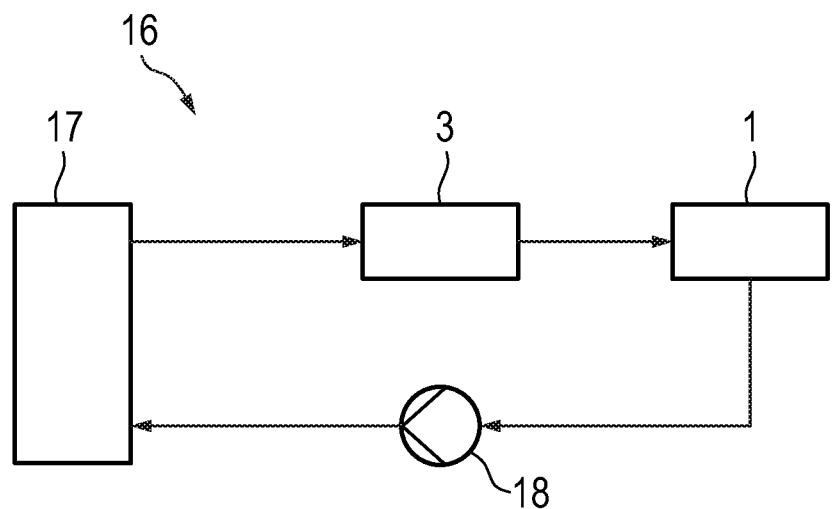
FIG. 8 illustrates an embodiment of a cooling circuit in a schematic illustration.
Figure 9:
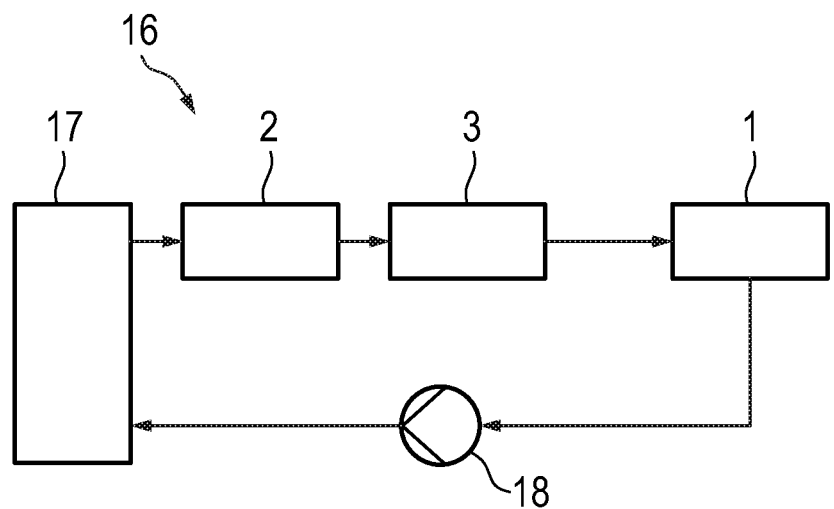
FIG. 9 illustrates an embodiment of a cooling circuit in a schematic illustration.

FIG. 8 shows an exemplary cooling circuit 16 in a motor vehicle comprising the pulse inverter 3 according to an embodiment of the invention. In the cooling circuit 16, the dielectric cooling oil circulates, wherein the cooling circuit 16 comprises a heat exchanger 17 and a pump 18, wherein, in the flow direction of the cooling fluid, the pulse inverter 3 is arranged upstream of the electric machine 1. Accordingly, the pulse inverter 3 is first flowed through and then the electric machine 1 is flowed through. In this context, it is considered particularly advantageous when the cooling fluid flowing out of the housing 7 of the electric machine 1 or the machine cooling system of the electric machine 1 is supplied such that the contact bars 9 electrically connecting the pulse inverter 3 and the electric machine 1 are directly contacted by the cooling fluid and cooled in this manner. FIG. 9 shows a further embodiment of the cooling circuit 16, wherein this embodiment differs substantially from the embodiment according to FIG. 8 in that the motor vehicle battery 2 is also flowed through by the cooling fluid for cooling the motor vehicle battery 2, wherein the motor vehicle battery 2 is arranged in the flow direction of the cooling fluid in front of the pulse inverter 3. Cooling fluid flowing from the high-volt battery 2 in the direction of the pulse inverter 3 directly contacts contact bars 9, which electrically connect the high-volt battery 2 and the pulse inverter 3, in order to cool them.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

1 Electric machine
2 Motor vehicle battery
3 Pulse inverter
4 Power module
Controller
6 Cooling device
7 Housing
8 Intermediate circuit capacitor
9 Contact bar
Cooling channel
11 Output
12 Further cooling channel
13 Input
14 Power module housing
Cooling structure
16 Cooling circuit
17 Heat exchanger
18 Pump
19 Row

The invention claimed is:

1. A pulse inverter for operating an electric machine of a motor vehicle, comprising:
a power module for converting DC current provided by a motor vehicle battery into AC current,
wherein the pulse inverter comprises a cooling device for cooling components of the pulse inverter by an electrically insulating cooling liquid flowing through the cooling device, wherein the cooling device comprises a fluid-tight housing,
wherein the components include the power module,
wherein the electrically insulating cooling liquid flowing through the fluid-tight housing is in direct contact with at least one of the components of the pulse inverter to be cooled,
wherein the cooling device further comprises a cooling channel, the electrically insulating cooling liquid entering the cooling channel originates from an outside of the fluid-tight housing,
wherein the power module is mounted to an outer surface of the cooling channel, wherein the cooling channel comprises an output, and
wherein the output opens into the fluid-tight housing, so that the electrically insulating cooling liquid flowing through the cooling device first flows through the cooling channel and subsequently the fluid-tight housing, then exits to the outside of the fluid-tight housing.

2. The pulse inverter according to claim 1, further comprising multiple additional power modules, wherein each of the multiple additional power modules are mounted to the outer surface of the cooling channel.

3. The pulse inverter according to claim 2, wherein the multiple additional power modules, multiple DC link capacitors, and multiple live contact bars connected to the power module and the multiple additional power modules are arranged in the fluid-tight housing,
wherein the components further include the multiple additional power modules, the multiple DC link capacitors, and the multiple live contact bars, and
wherein the electrically insulating cooling liquid flowing through the fluid-tight housing is in direct contact with the multiple additional power modules, the multiple DC link capacitors, and the multiple live contact bars.

4. The pulse inverter according to claim 3, wherein the cooling device further comprises a further cooling channel,
wherein the DC link capacitors are thermally connected to an outer surface of the further cooling channel,
wherein the further cooling channel comprises an output,
wherein the output of the further cooling channel opens into the cooling channel, so that the electrically insulating cooling liquid flowing through the cooling device initially flows through the further cooling channel from the outside of the fluid-tight housing, subsequently the cooling channel, and subsequently the fluid-tight housing, then exits to the outside of the fluid-tight housing.

5. The pulse inverter according to claim 1, wherein the power module is in direct contact with the electrically insulating cooling liquid flowing through the fluid-tight housing.

6. The pulse inverter according to claim 1, wherein the cooling channel is arranged within the fluid-tight housing such that the electrically insulating cooling liquid flowing through the fluid-tight housing flows around the cooling channel.

7. The pulse inverter according to claim 1, wherein the power module comprises a fluid-tight power module housing, wherein semiconductor structural parts of the power module are arranged within the power module housing.

8. A motor vehicle comprising:
a motor vehicle battery,
an electric machine, and
a pulse inverter for operating the electric machine,
wherein the pulse inverter comprises a power module for converting DC current provided by the motor vehicle battery into AC current, wherein the pulse inverter comprises a cooling device for cooling components of the pulse inverter by an electrically insulating cooling liquid flowing through the cooling device, wherein the components include the power module, wherein the cooling device comprises a fluid-tight housing, wherein the electrically insulating cooling liquid flowing through the fluid-tight housing is in direct contact with at least one of the components of the pulse inverter to be cooled, wherein the cooling device further comprises a cooling channel, the electrically insulating cooling liquid entering the cooling channel originates from outside of the fluid-tight housing, wherein the power module is thermally connected mounted to an outer surface of the cooling channel, wherein the cooling channel comprises an output, and wherein the output opens into the fluid-tight housing, so that the electrically insulating cooling liquid flowing through the cooling device first flows through the cooling channel and subsequently the fluid-tight housing, then exits the fluid-tight housing.

9. The motor vehicle according to claim 8, wherein the motor vehicle comprises a machine cooling system for cooling the electric machine, wherein the electrically insulating cooling liquid flowing out of the fluid-tight housing flows into the machine cooling system.

10. The motor vehicle according to claim 9, wherein the components further include contact bars, and wherein the electrically insulating cooling liquid flowing from the cooling device to the machine cooling system directly contacts the contact bars that electrically connect the pulse inverter and the electric machine.

11. A pulse inverter for operating an electric machine of a motor vehicle, comprising:

a plurality of components, including a plurality of power modules, a plurality of DC link capacitors, a plurality of live contact bars, the plurality of power modules configured to convert DC current provided by a motor vehicle battery into AC current, wherein the pulse inverter comprises a cooling device for cooling the plurality of components of the pulse inverter by an electrically insulating cooling fluid flowing through the cooling device, wherein the cooling device comprises a fluid-tight housing, wherein the electrically insulating cooling fluid flowing through the fluid-tight housing is in direct contact with at least one of the plurality of components of the pulse inverter to be cooled, wherein the cooling device further comprises a cooling channel, the electrically insulating cooling fluid entering the cooling channel originates from an outside of the fluid-tight housing, wherein each of the plurality of power modules is mounted to an outer surface of the cooling channel, wherein the cooling channel comprises an output, wherein the output opens into the fluid-tight housing, so that the electrically insulating cooling fluid flowing through the cooling device first flows through the cooling channel and subsequently the fluid-tight housing, then exits to the outside of the fluid-tight housing, wherein the plurality of components are arranged in the fluid-tight housing, and wherein the electrically insulating cooling fluid flowing through the fluid-tight housing is in direct contact with the plurality of power modules, the plurality of DC link capacitors, and the plurality of live contact bars.

* * * * *